United States Patent
Garrelts et al.

(10) Patent No.: US 11,658,472 B2
(45) Date of Patent: May 23, 2023

(54) SURGE PROTECTION DEVICE WITH PROTECTION LEVEL DETERMINATION AND METHODS OF OPERATING THE SAME

(71) Applicant: Eaton Intelligent Power Limited, Dublin (IE)

(72) Inventors: Douglas Garrelts, Raleigh, NC (US); James Nicholas Skoczlas, Bridgeville, PA (US)

(73) Assignee: Eaton Intelligent Power Limited, Dublin (IE)

( * ) Notice: Subject to any disclaimer, the term of this patent is extended or adjusted under 35 U.S.C. 154(b) by 180 days.

(21) Appl. No.: 17/077,737

(22) Filed: Oct. 22, 2020

(65) Prior Publication Data

US 2022/0131361 A1  Apr. 28, 2022

(51) Int. Cl.
*H02H 3/04* (2006.01)
*H02H 1/00* (2006.01)
*H02H 3/05* (2006.01)
*G01R 31/327* (2006.01)

(52) U.S. Cl.
CPC ......... *H02H 3/044* (2013.01); *G01R 31/3277* (2013.01); *H02H 1/0007* (2013.01); *H02H 3/05* (2013.01)

(58) Field of Classification Search
CPC ........ H02H 3/044; H02H 1/0007; H02H 3/05; H02H 9/042; G01R 31/3277
See application file for complete search history.

(56) References Cited

U.S. PATENT DOCUMENTS

| 4,594,051 | A | 6/1986 | Gaston |
| 8,179,653 | B2 | 5/2012 | Gerlach |
| 9,401,594 | B2 | 7/2016 | Zhu et al. |
| 10,110,216 | B1 * | 10/2018 | Knoedgen ............. H02H 7/205 |

(Continued)

OTHER PUBLICATIONS

Submittal Specification Sheet, Eaton Innovative Technology, Model PTX160 Surge Protective Device, UL 1449 3rd Edition; Aug. 2011; 2 pages.

(Continued)

*Primary Examiner* — Alvaro E Fortich
*Assistant Examiner* — Zannatul Ferdous
(74) *Attorney, Agent, or Firm* — Stanek Lemon Crouse & Meeks, P.A.

(57) ABSTRACT

An apparatus includes a plurality of surge protection devices (e.g., multiple metal oxide varistors connected in parallel) configured to be coupled to a power system, a plurality of mechanical actuators associated with respective ones of the surge protection devices and configured to indicate status of the associated surge protection devices, and a detector circuit configured to sense actuation of the actuators and responsively determine a protection status of the plurality of surge protection devices. The detector circuit may include a plurality of switches configured to be actuated by respective ones of the actuators. The detector circuit may further include a processor coupled to the plurality of switches and configured to determine states of switches and to determine the protection status based on the determined status of the switches. The processor may be configured to interpret the status of the switches based on a stored identifier.

12 Claims, 7 Drawing Sheets

(56) References Cited

U.S. PATENT DOCUMENTS

| | | |
|---|---|---|
| 2004/0085696 A1 | 5/2004 | Mendoza |
| 2006/0232906 A1 | 10/2006 | Sueoka |
| 2007/0097584 A1 | 5/2007 | Ducharme |
| 2009/0323242 A1 | 12/2009 | Shibayama |
| 2010/0014205 A1* | 1/2010 | Gerlach .................. H02H 9/042 |
| | | 361/111 |
| 2015/0364916 A1 | 12/2015 | Chung |
| 2016/0126728 A1 | 5/2016 | Kawabata |
| 2016/0212265 A1* | 7/2016 | Philonenko ......... H04M 3/5233 |
| 2017/0287664 A1* | 10/2017 | Elsherbini ............. H01H 37/00 |
| 2018/0224873 A1 | 8/2018 | Motz et al. |
| 2018/0331093 A1* | 11/2018 | Takahashi ........... H01L 27/0255 |
| 2019/0044322 A1* | 2/2019 | Hijazi ....................... G06F 1/28 |
| 2019/0393698 A1* | 12/2019 | Joo ...................... H02H 1/0007 |

OTHER PUBLICATIONS

*Eaton Innovative Technology Protector*, Technical Data TD01006002E; Jan. 2019; pp. 1-8.
*Eaton Innovative Technology XT Surge Protective Device*; Technical Data TD0100600E; Nov. 2018; pp. 1-4.
*Innovative Technology Surge Protection Solutions*; Eaton Innovative Technology; (2016) pp. 1-8.

* cited by examiner

| OVERVIEW | | | |
|---|---|---|---|
| DEVICE INFO | | SPD STATUS [% PROTECTION REMAINING] | |
| ASSIGNED NAME | STORED IP SPD | % OF PROTECTION ON PHASE A | 100 |
| CATALOG NUMBER | SPD100208Y4C | % OF PROTECTION ON PHASE B | 100 |
| SERIAL NUMBER | 20 | % OF PROTECTION ON PHASE C | 100 |
| DATE CODE | 200615 | % OF PROTECTION ON N-G | 100 |
| FIRMWARE REVISION | 1.0.7 | | |
| ETHERNET MAC ADDRESS | 00:20:85:02:E7:09 | | |
| PRESENT ETHERNET ADDRESS | 10.130.150.220P | | |

| SURGE COUNTS | | ALARM |
|---|---|---|
| | | ALARM STATUS |
| PHASE A TOTAL SURGE COUNTS | 1021 | |
| PHASE A HIGH SURGE COUNT | 135 | |
| PHASE A MEDIUM SURGE COUNT | 30 | |
| PHASE A LOW SURGE COUNT | 856 | |
| PHASE B TOTAL SURGE COUNTS | 2225 | |
| PHASE B HIGH SURGE COUNT | 324 | |
| PHASE B MEDIUM SURGE COUNT | 1139 | |
| PHASE B LOW SURGE COUNT | 762 | |
| PHASE C TOTAL SURGE COUNTS | 1002 | |
| PHASE C HIGH SURGE COUNT | 921 | |
| PHASE C MEDIUM SURGE COUNT | 59 | |
| PHASE C LOW SURGE COUNT | 22 | |

FIG. 10

SURGE PROTECTION DEVICE WITH PROTECTION LEVEL DETERMINATION AND METHODS OF OPERATING THE SAME

BACKGROUND

Surge protection devices (SPDs) are commonly used to protect electrical and electronic equipment from damage caused by high energy lightning surges and other transient disturbances. These devices typically operate by shunting surge currents away from the protected component using devices such as a metal oxide varistor (MOVs), which can provide a low-impedance shunt path for the surge current. A typical SPD unit may include circuitry to detect when a surge protection device (e.g., MOV) has failed and is incapable of providing protection.

A typical application for an SPD is shown in FIG. 1, where an SPD 20 is coupled to a distribution panel 10 that distributes power from a feeder circuit 12 to multiple branch circuits 14. The SPD 20 may, for example, be coupled to bus bars within the panel 10 and may be located external to the panel 10 or integrated therein. SPDs may be similarly used in switchgear, switchboards, busways, motor control centers (MCCs), and the like.

SUMMARY

Some embodiments of the inventive subject matter provide an apparatus including a plurality of surge protection devices (e.g., multiple metal oxide varistors connected in parallel) configured to be coupled to a power system. The apparatus further includes a plurality of mechanical actuators associated with respective ones of the surge protection devices and configured to indicate status of the associated surge protection devices. A detector circuit is configured to sense actuation of the actuators and responsively determine a protection status of the plurality of surge protection devices. The detector circuit may include a plurality of switches configured to be actuated by respective ones of the actuators. The detector circuit may further include a processor coupled to the plurality of switches and configured to determine states of switches and to determine the protection status based on the determined status of the switches. The processor may be configured to store an identifier of a configuration of the surge protection devices and to interpret the status of the switches based on the stored identifier.

According to some embodiments, the surge protection devices may be disposed on a first substrate and the switches may be disposed a second substrate overlapping the first substrate such that the switches are disposed opposite the surge protection devices. The actuators may include respective members configured to move along a direction perpendicular to the first and second substrates to activate the switches.

In further embodiments, the apparatus may further include a display configured to display the determined protection status. In some embodiments, the apparatus may include means for providing a web page that indicates the determined protection status.

Some embodiments of the inventive subject matter provide an apparatus including a plurality of surge protection devices coupled in parallel and a detector circuit configured to sense states of the surge protection devices and to discriminate at least three different protection levels provided by the surge protection device. The apparatus may include a plurality of mechanical actuators associated with respective ones of the surge protection devices and configured to indicate status of the associated surge protection devices and the detector circuit may be configured to sense actuation of the actuators and responsively determine a protection level provided by the plurality of surge protection devices. The detector circuit may include a plurality of switches configured to be actuated by respective ones of the actuators. The detector circuit may further include a processor coupled to the plurality of switches and configured to determine states of switches and to determine a protection level based on the determined states of the switches. The processor may be configured to store an identifier of a configuration of the surge protection devices and to interpret the status of the switches based on the stored identifier.

Further embodiments provide methods including detecting movement of an actuator associated with a surge protection device of a plurality of surge protection devices and determining a protection level provided by the plurality of surge protection devices responsive to the detected movement. Detecting movement of the actuator may include detecting a state of switch configured to be actuated by the actuator. Detecting a state of switch configured to be actuated by the actuator may be preceded by storing an identifier of a configuration of the surge protection devices and determining a protection level provided by the plurality of surge protection devices responsive to the detected movement may include interpreting a status of the switch based on the identifier.

BRIEF DESCRIPTION OF THE DRAWINGS

FIG. 10 illustrates a web page for reporting protection status of an SPD according to further embodiments.

DETAILED DESCRIPTION

Figure 1:
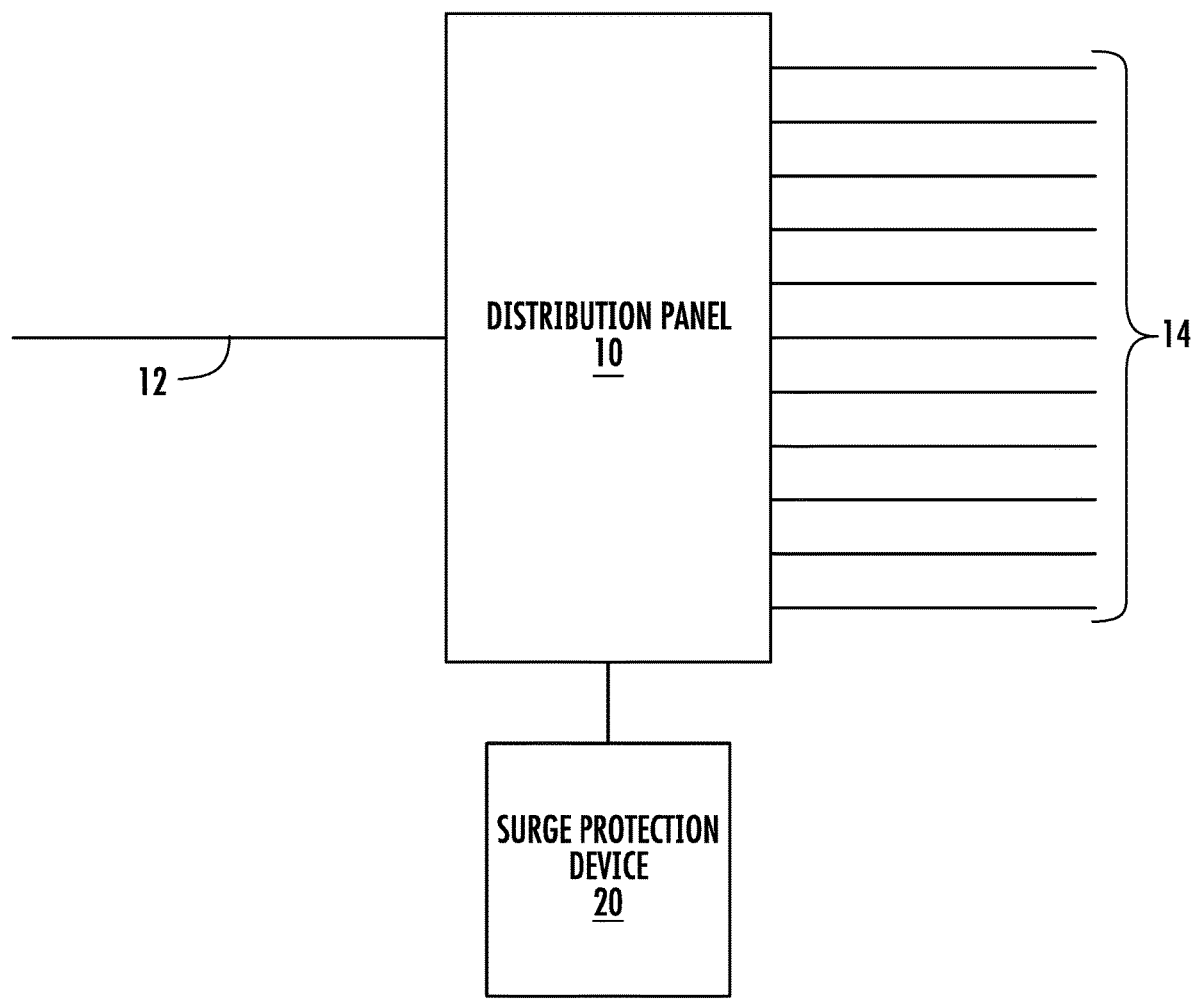
FIG. 1 illustrates a typical application of a surge protection device (SPD)

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Figure 2:
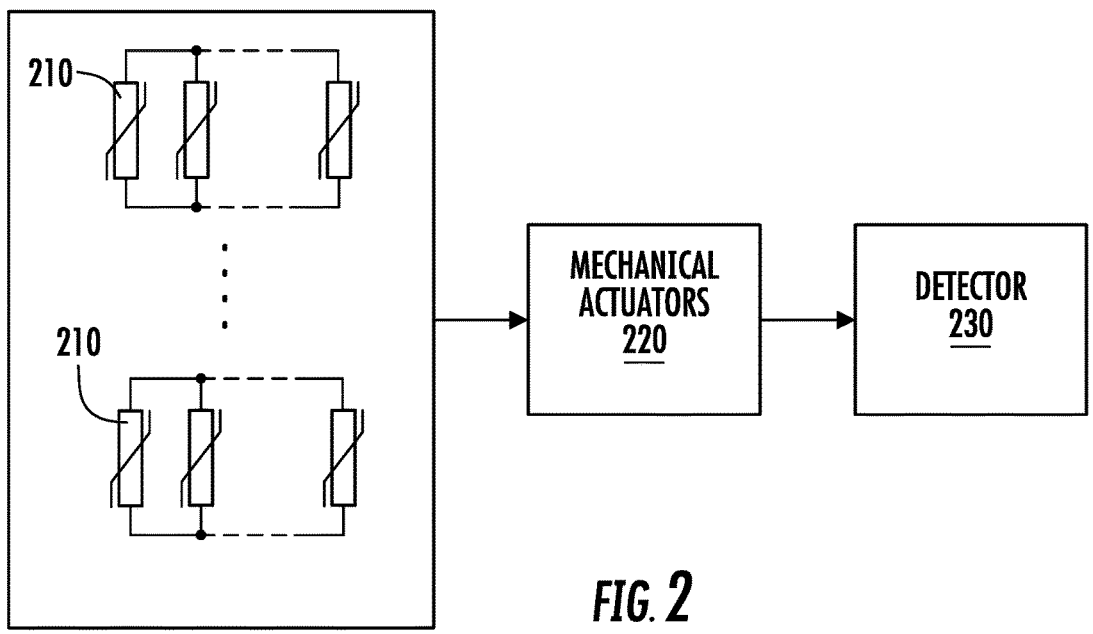
FIG. 2 is a schematic diagram illustrating a surge protection apparatus according to some embodiments of the inventive subject matter.

FIG. 2 illustrates a surge protection apparatus according to some embodiments of the inventive subject matter. The apparatus includes one or more groups of parallel-connected surge protection devices, here shown as metal oxide varistors (MOVs) 210, each group protecting a respective phase or a neutral to ground. The surge protection devices 210 may be coupled, for example, to a distribution panel, switchgear, switchboard, busway, motor control center (MCC), or other type of electrical equipment. A plurality of mechanical actuators 220 are associated with respective ones of the MOVs 210 and are configured to operate responsive to a status of the associated MOVs 210. A detector circuit 230 is configured to determine a protection status of the groups of MOVs 210 responsive to the mechanical actuators 220. For example, the actuators 220 may be movable arms, tabs or other members that are configured to move responsive to failure or other change of status of the associated MOVs 210. The detector circuit 230 may be configured to detect such movement and to responsively determine a protection status (e.g. a protection level) provided by the group of parallel-connected MOVs 210.

Figure 3:
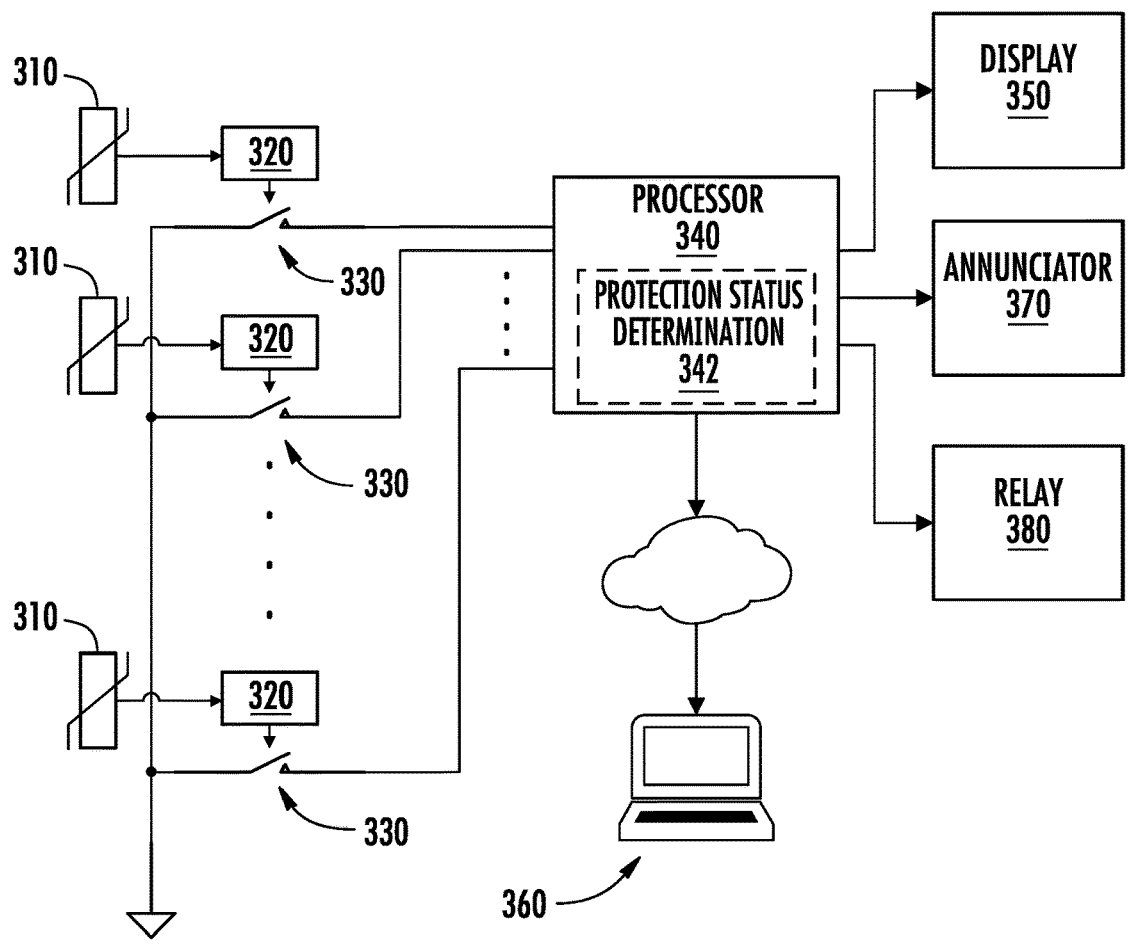
FIG. 3 is a schematic diagram illustrating an SPD according to further embodiments.
Figure 4:
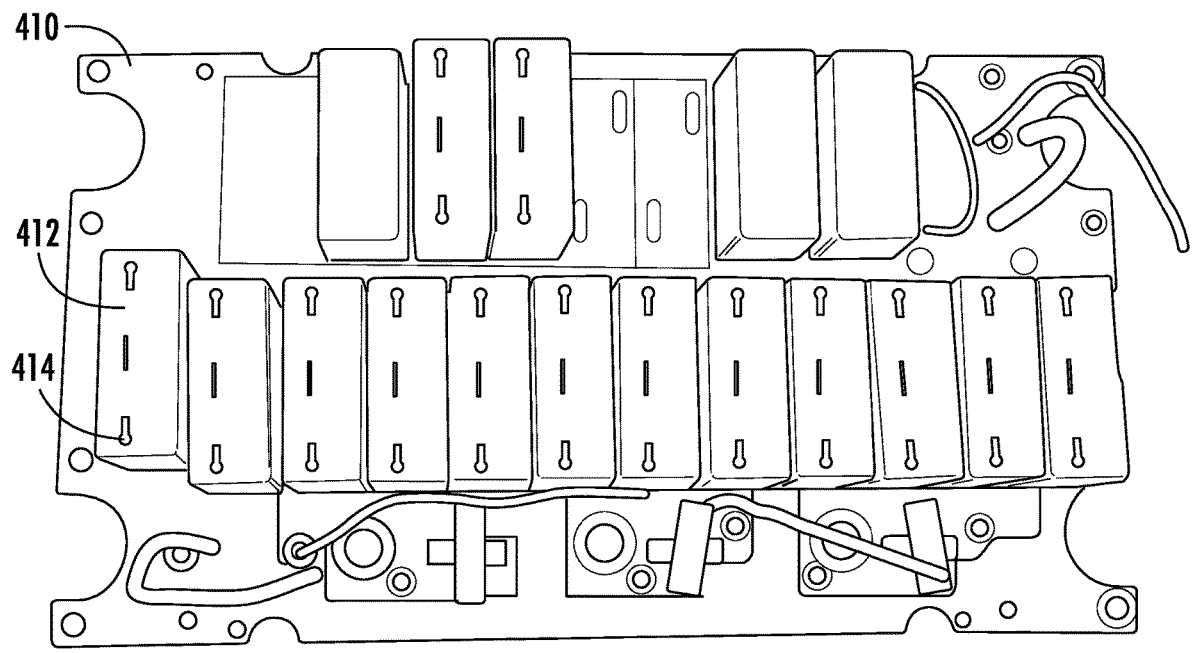
FIG. 4 is a perspective view of a MOV board of an SPD according to some embodiments.
Figure 5:
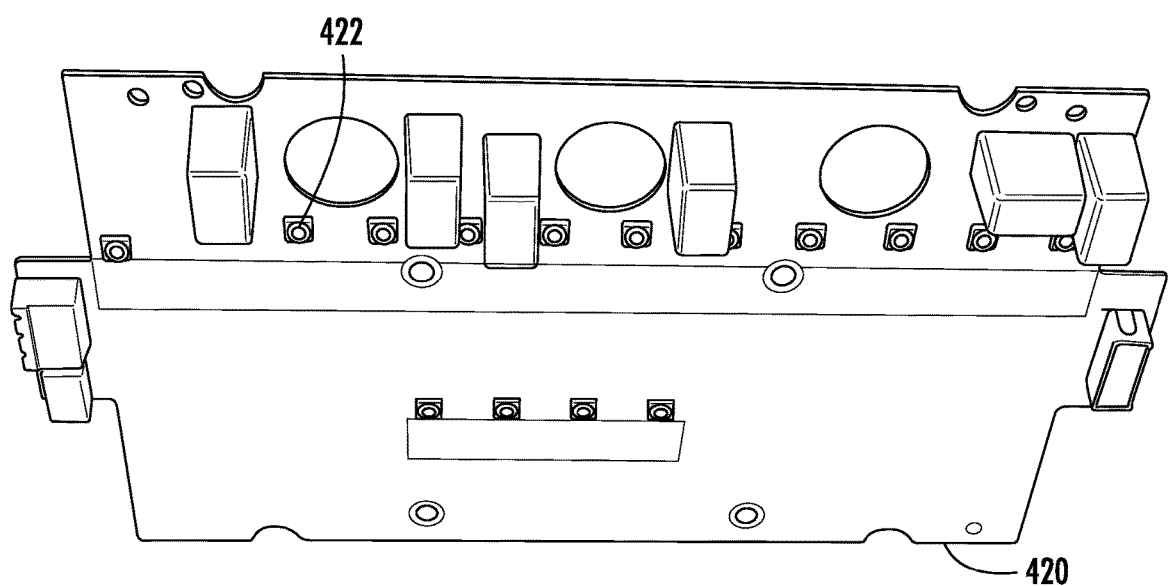
FIG. 5 a perspective view of a control board of an SPD according to further embodiments.

FIG. 3 illustrates an example implementation of such an apparatus according to further embodiments. MOVs 310 are associated with respective mechanical actuators 320 that move responsive to states of the associated MOVs 310. The actuators 320 are configured to engage respective switches 330, which are coupled to a processor circuit 340 (e.g., a microcontroller and associated peripheral circuitry, such as memory and interface circuitry). The processor circuit 340 hosts a protection status determination application 342, which is configured to receive inputs from the switches 330 and to responsively determine a protection status afforded by the MOVs 310. For example, the protection status determination application 342 may determine a number of the MOVs 310 that have failed or otherwise have become inactive and to determine a protection level (e.g., a percentage) afforded by remaining non-failed ones of the MOVs 310. The protection status determination application 342 may be configured to provide an indication of the determined protection level to a display 350 and/or to a remote device 360 using, for example, a webpage accessible over a network. The protection status determination application 342 may be further configured to provide an alarm using, for example, an annunciator 370 coupled to the processor circuit 340. The protection status determination application 342 may also be configured to activate a relay 380 that, for example, may be used to signal and/or control an external device.

Figure 6:
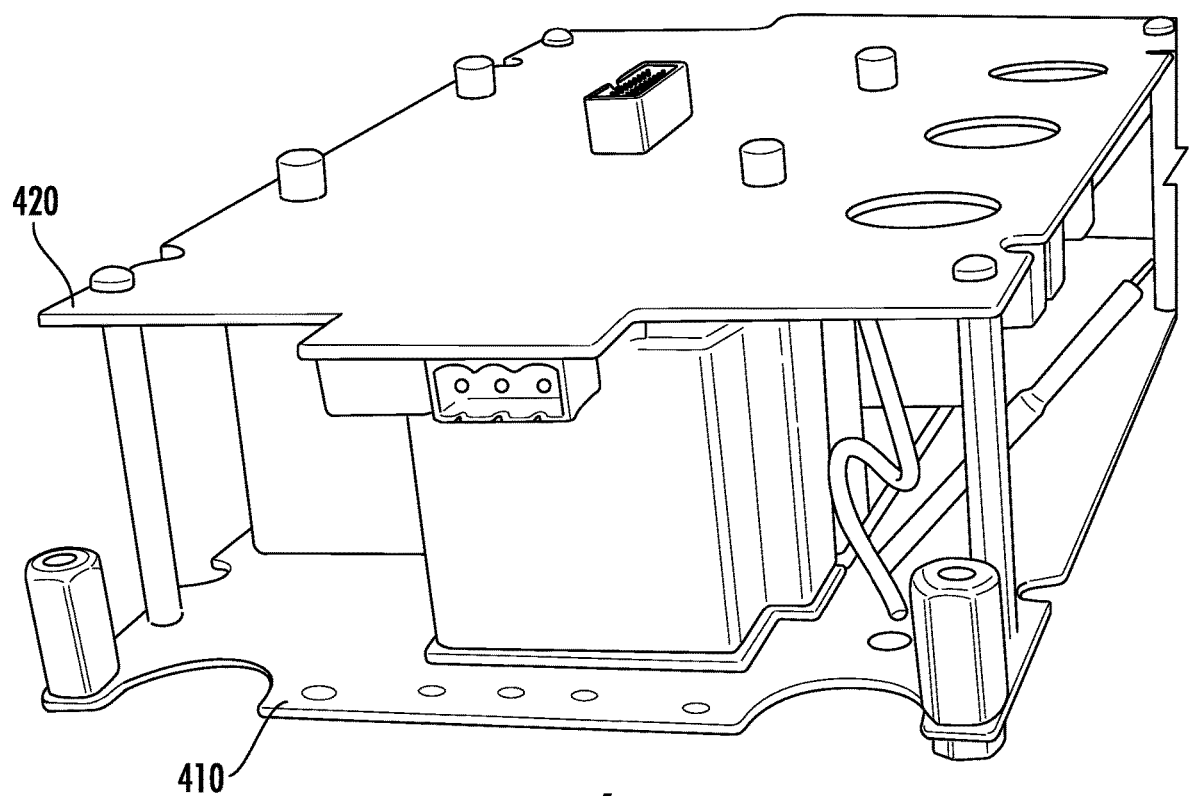
FIG. 6 is perspective view of the MOV and control boards of FIGS. 3 and 4 in an assembled relationship.
Figure 7:
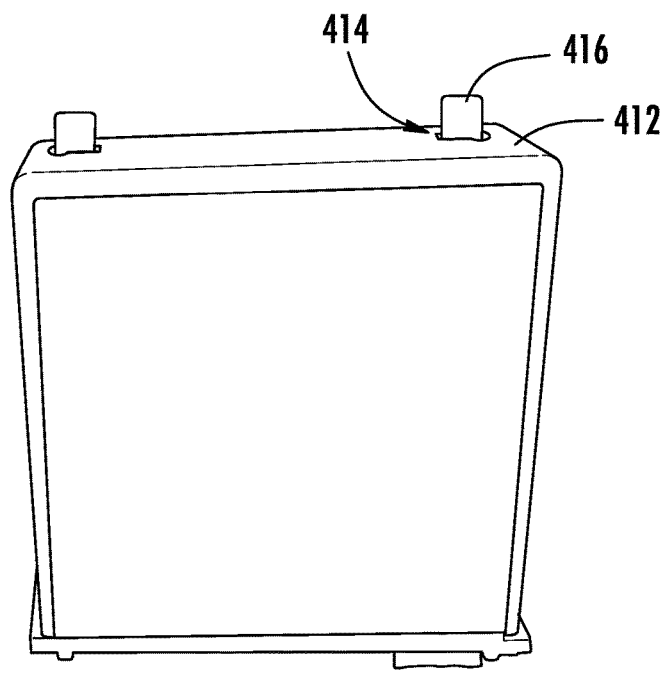
FIG. 7 is a perspective view of an MOV of the MOV board of FIG. 3.

FIGS. 4-7 illustrate an example implementation of circuitry along the lines illustrated in FIG. 3. MOV modules 412 are mounted on a first substrate 410. Corresponding switches 422 are mounted in second substrate 420. As shown in FIG. 6, the first and second substrates 410, 420 are mounted in an opposed fashion such that respective ones of the MOV modules 412 face respective ones of the switches 422. As shown in FIG. 7, the MOV modules 412 include tab-like actuators 416 that are configured to extend from the interior of the modules 412 through the slots 414 to actuate the switches 422 when the MOVs within the MOV modules 412 fail.

Figure 8:
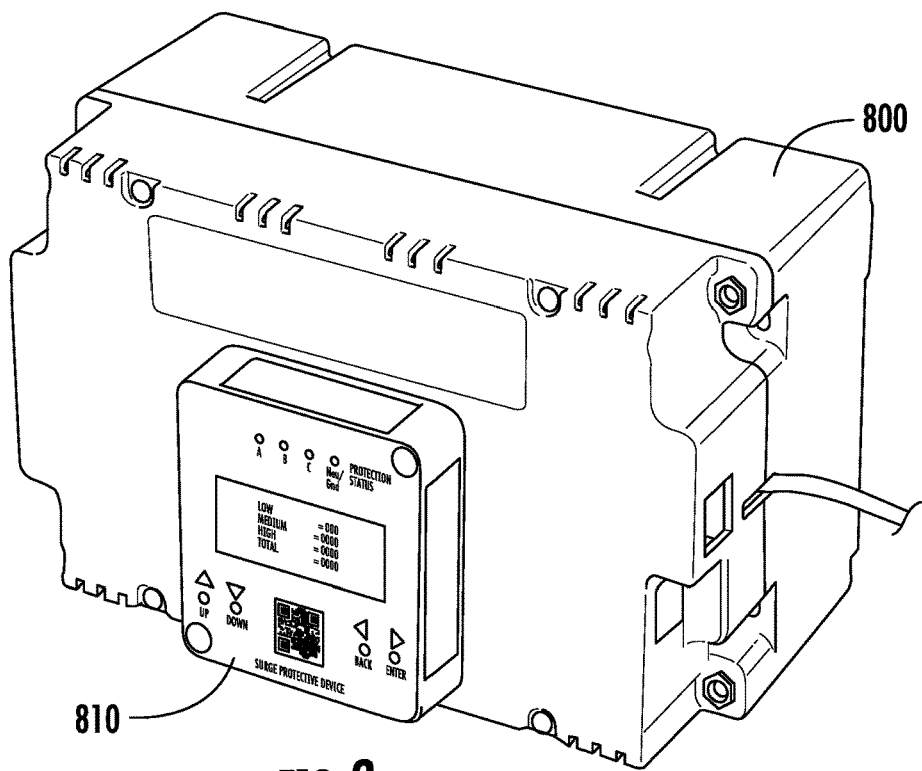
FIG. 8 is a perspective view of an SPD according to further embodiments.

FIG. 8 illustrates an SPD unit 800 that may include the circuit board arrangement illustrated in FIGS. 4-7. The SPD unit 800 further includes a display 810 which may be used to provide a display of surge protection status. As shown in FIG. 8, the display 810 may include, for example, multiple multi-color LEDs 812 that may be used to display respective protection levels for phases A,B,C protected by respective groups of parallel-connected MOVs. For example, the LEDs 812 may provide a green output to represent a high level of protection, a yellow output to indicate a medium level of protection and a red output to indicate a low level of protection, as explained in detail below.

According to further aspects, surge protection devices using common circuitry and software along the lines described above may be tailored for use in a variety of different power system configurations, e.g., 3-phase delta or wye, high-leg delta, single phase, split phase, etc. For example, SPDs may use a common hardware configuration as shown in FIGS. 4-7, e.g., the first and second opposed circuit substrates 410, 420, with the first substrate 410 being populated with MOV modules 412 in a manner that suits the particular application. Software used by the SPDs (e.g., by a processor such as the processor 340 of FIG. 3) may be configured to identify the particular configuration application and interpret information from the MOV status detection switches (e.g., switches such as switches 330 of FIG. 3) accordingly.

In some embodiments, the SPD may store a model number that encodes the applicable power system configuration for the particular SPD. The SPD's processor may decode the model number to determine the power configuration served by the unit, e.g., whether it is three-phase delta or wye, high-leg delta, single or split phase, etc., and, hence, which phases are active in the system. Digits within the model number may indicate which MOVs are installed in the unit based on the voltage configuration and surge current rating of the unit, that is, how many MOVs are installed per phase and per neutral to ground (if applicable). If a switch is closed as the result of its associated MOV triggering, the switch input for that MOV maybe pulled low, signaling to the SPD's processor that the corresponding MOV has failed or otherwise become inactive. Based on the decoded model number and the number of switches open or closed per phase, the processor can calculate the level of protection remaining for the relevant phases and neutral to ground. Boolean algebra for determining a protection status LED indicator color may take the form of:

Green=$S1 \cdot Sn$;

Yellow=$(S1'+Sn') \cdot (S1+Sn)$; and

Red=$S1' \cdot Sn'$, where Si is an ith switch, Sx=1, Sx'=0, "·"=AND, "+"=OR.

For each phase or neutral, the LED will be green if all MOVs installed for the phase are still operative, meaning that full protection remains. The LED may be turned yellow if at least one but not all the MOVs within the phase have failed or been otherwise deactivated, meaning that protection has been reduced. The LED may be turned red if all MOVs within the phase have failed or otherwise become inactive, meaning that no protection remains. A red LED state may also trigger activation of an alarm (e.g., FIG. 3 annunciator 370) and cause a signaling/control relay (e.g., FIG. 3 relay 380) to change state.

Figure 9:
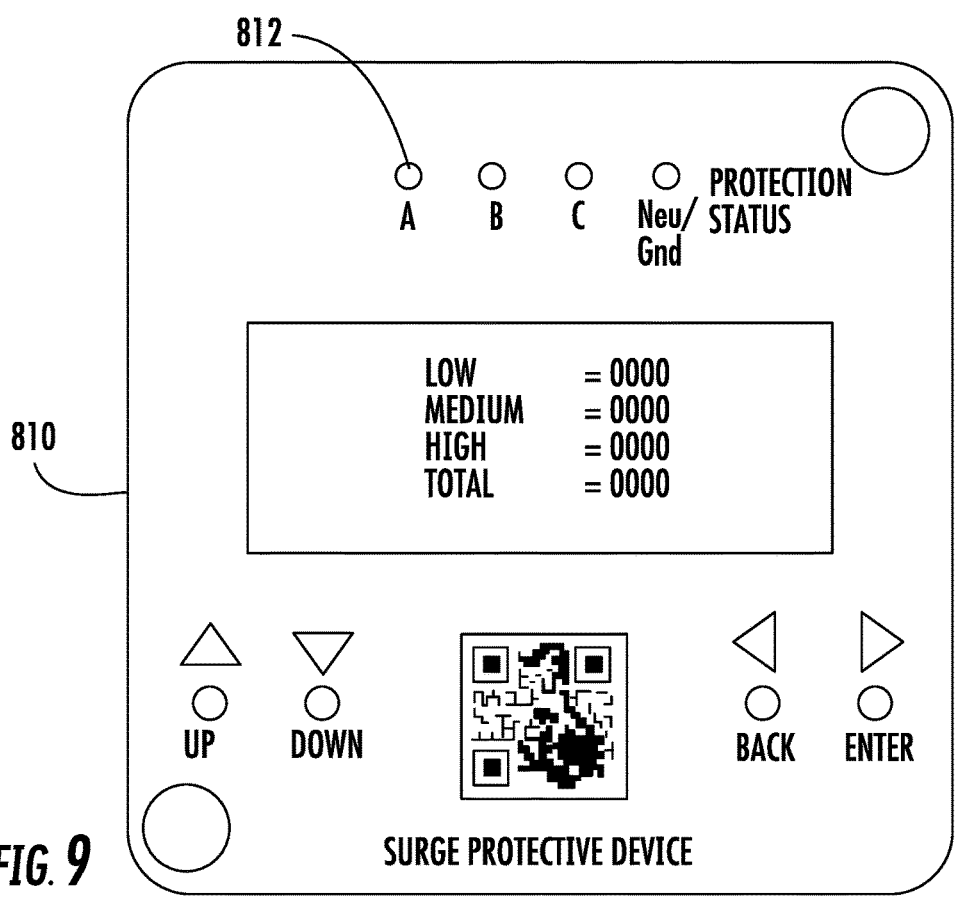
FIG. 9 is a detailed view of a display of the SPD of FIG. 8.

The SPD processor may also be configured to calculate a percentage of protection remaining by, for example, dividing the number of MOVs that are still operative for a given phase by the total number of MOVs installed for that phase. This calculation may take the form of:

$$\% \text{ Protection}=(100)(S1+Sn)/n$$

for units containing a neutral. The calculation of percentage protection may be more complex for delta systems where an actual neutral is replaced by a virtual neutral (e.g., a neutral derived from phase voltages). A percentage of protection may be reported on a local display (e.g., the display 810 of FIGS. 8 and 9) and/or on a remotely accessible webpage, as shown in FIG. 10.

Figure 11:
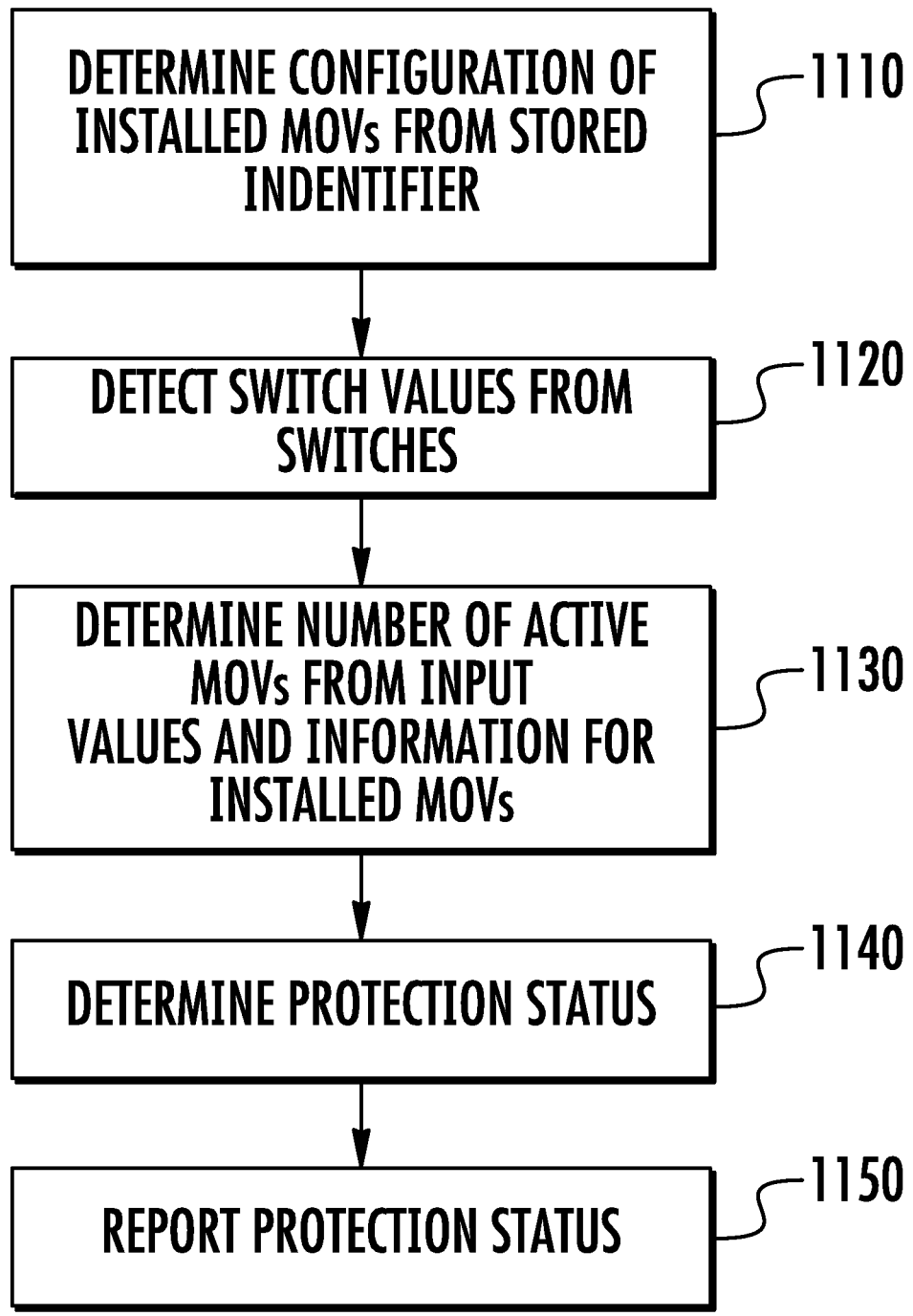
FIG. 11 is a flowchart illustrating operations for determining protection status of an SPD according to some embodiments.

FIG. 11 illustrates operations for determining a protection level according to some embodiments. A configuration of installed MOVs (e.g., phase connections, neutral to ground connections and numbers of MOVs per phase and/or neutral to ground) is determined from a stored identifier (e.g., model number) of an SPD (block 1110). Input values from switches associated with respective ones of the MOVs are detected (block 1120). A number of active MOVs is determined from the detected input values and the configuration information for the installed MOVs (block 1130). A protection status (e.g., a protection level) for a phase and/or a neutral to ground is determined from the number of active MOVs and the number of installed MOVs (block 1140). The protection status is reported using, for example, a local display and/or a web page (block 1150).

It will be appreciated that further embodiments may vary from the exemplary embodiments described above. For example, an SPD according to some embodiments may be configured to discriminate among more than three protection levels. Embodiments of the inventive subject matter may include embodiments that use surge protection devices other than MOVs, such as transient voltage suppression (TVS) diodes, gas discharge tubes (GDTs), crowbar circuits, and the like.

In this specification, there have been disclosed embodiments of the inventive subject matter and, although specific terms are employed, they are used in a generic and descriptive sense only and not for purposes of limitation. The following claims are provided to ensure that the present application meets all statutory requirements as a priority application in all jurisdictions and shall not be construed as limiting the scope of the inventive subject matter.

What is claimed:

1. An apparatus comprising:
    a plurality of surge protection devices configured to be coupled to a power system;
    a plurality of mechanical actuators associated with respective ones of the surge protection devices and configured to move to indicate status of the associated surge protection devices; and
    a detector circuit configured to sense actuation of the actuators and responsively determine a protection status of the plurality of surge protection devices.

2. The apparatus of claim 1, wherein the detector circuit is configured to determine a number of the actuators that have been actuated and to determine the protection status based on the determined number of actuators.

3. The apparatus of claim 1, wherein the detector circuit comprises a plurality of switches configured to be actuated by respective ones of the actuators.

4. The apparatus of claim 3, wherein the detector circuit further comprises a processor coupled to the plurality of switches and configured to determine states of the switches and to determine the protection status based on the determined states of the switches.

5. The apparatus of claim 4, wherein the processor is configured to store an identifier of a configuration of the surge protection devices and to interpret the states of the switches based on the stored identifier.

6. The apparatus of claim 3:
    wherein the surge protection devices are disposed on a first substrate; and
    wherein the switches are disposed a second substrate overlapping the first substrate such that the switches are disposed opposite the surge protection devices.

7. The apparatus of claim 6, wherein the actuators comprise respective members configured to move along a direction perpendicular to the first and second substrates to activate the switches.

8. The apparatus of claim 1, further comprising a display configured to display the determined protection status.

9. The apparatus of claim 1, further comprising means for providing a web page that indicates the determined protection status.

10. The apparatus of claim 1, wherein actuators are configured to indicate a failure of the surge protection device when actuated.

11. The apparatus of claim 1, wherein the surge protection devices are coupled in parallel.

12. The apparatus of claim 1, wherein the surge protection devices comprise metal oxide varistors.

* * * * *